(12) United States Patent
Yamanaka et al.

(10) Patent No.: US 7,709,795 B2
(45) Date of Patent: May 4, 2010

(54) INFRARED SENSOR UNIT AND PROCESS OF FABRICATING THE SAME

(75) Inventors: Hiroshi Yamanaka, Moriguchi (JP);
Tsutomu Ichihara, Hirakata (JP);
Yoshifumi Watabe, Tondabayashi (JP);
Koji Tsuji, Suita (JP); Masao Kirihara, Kadoma (JP); Takaaki Yoshihara, Osaka (JP); Yoichi Nishijima, Osaka (JP); Satoshi Hyodo, Ashiya (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 18 days.

(21) Appl. No.: 12/063,850

(22) PCT Filed: Aug. 16, 2006

(86) PCT No.: PCT/JP2006/316444

§ 371 (c)(1),
(2), (4) Date: Feb. 14, 2008

(87) PCT Pub. No.: WO2007/021030

PCT Pub. Date: Feb. 22, 2007

(65) Prior Publication Data

US 2009/0114819 A1 May 7, 2009

(30) Foreign Application Priority Data

Aug. 17, 2005 (JP) ............................. 2005-236868

(51) Int. Cl.
*G01J 5/20* (2006.01)
(52) U.S. Cl. .................................................. 250/338.1
(58) Field of Classification Search ............... 250/338.1
See application file for complete search history.

(56) References Cited

U.S. PATENT DOCUMENTS

| 5,021,663 | A | 6/1991 | Hornbeck |
| 6,046,485 | A | 4/2000 | Cole et al. |
| 6,133,572 | A | 10/2000 | Cunningham |
| 6,359,276 | B1 | 3/2002 | Tu |
| 6,690,014 | B1 | 2/2004 | Gooch et al. |
| 7,145,141 | B2 * | 12/2006 | Kim et al. ................. 250/338.1 |

FOREIGN PATENT DOCUMENTS

| EP | 1 142 832 A1 | 10/2001 |
| EP | 1 462 782 A1 | 9/2004 |
| JP | 08-330558 A | 12/1996 |

OTHER PUBLICATIONS

International Search Report for Application No. PCT/JP2006/316444, mailed Nov. 24, 2006.
The First Office Action for the Application No, 200680030068.8 from The State Intellectual Property Office of the People's Republic of China dated Jun. 19, 2009.

* cited by examiner

*Primary Examiner*—Constantine Hannaher
(74) *Attorney, Agent, or Firm*—Cheng Law Group, PLLC

(57) ABSTRACT

An infrared sensor unit has a thermal infrared sensor and an associated semiconductor device commonly developed on a semiconductor substrate. A dielectric top layer covers the substrate to conceal the semiconductor device formed in the top surface of the substrate. The thermal infrared sensor carried on a sensor mount which is supported above the semiconductor device by means of a thermal insulation support. The sensor mount and the support are made of a porous material which is superimposed on top of the dielectric top layer.

6 Claims, 5 Drawing Sheets

INFRARED SENSOR UNIT AND PROCESS OF FABRICATING THE SAME

TECHNICAL FIELD

The present invention is directed to an infrared sensor unit, more particularly to such unit including a thermal infrared sensor and an associated semiconductor device formed on a common semiconductor substrate, and a process of fabricating the infrared sensor unit.

BACKGROUND ART

U.S. Pat. No. 6,359,276 discloses an infrared sensor unit composed of a thermal infrared sensor and a semiconductor device which are arranged in a side-by-side relation on top of a semiconductor substrate. The thermal infrared sensor is supported in the semiconductor substrate by means of porous thermal insulation support. The porous thermal insulation support is realized as a part of the semiconductor substrate for mounting thereon the infrared sensor in a thermally insulating relation from the remainder of the substrate. The porous thermal insulation support is composed of a sensor mount and a set of porous bridges connecting the sensor mount to the substrate. Each of the sensor mount and the bridges are formed by anodizing a top part of a doped region formed in the surface of the semiconductor substrate into a porous body. Thus, the prior art makes the best use of the semiconductor substrate carrying the semiconductor device to give the thermally insulation support for the infrared sensor. However, there remains a problem that the infrared sensor cannot be disposed immediately upwardly of the semiconductor device since the thermal insulation support is only made by anodizing the top surface of the semiconductor substrate at a portion horizontally spaced away from the semiconductor device. Due to this limitation, the infrared sensor unit is difficult to be made compact. Especially, when a plurality of the infrared sensor units are arranged in a two-dimensional array to constitute a thermal image sensor, the sensor units cannot be densely packed and therefore suffer from lowered resolution.

DISCLOSURE OF THE INVENTION

In view of the above problem, the present invention has been achieved to provide an improved infrared sensor unit which is capable of being made compact in combination with an associated semiconductor device formed in a common semiconductor substrate. The infrared sensor unit in accordance with the present invention includes the semiconductor substrate configured to be formed in its top surface with a semiconductor device and to be covered on its top surface with a dielectric top layer concealing the semiconductor device, and a sensor mount carrying a thermal infrared sensor. A thermal insulation support is included to support the sensor mount above the semiconductor device. Both of the sensor mount and the thermal insulation support is made of a porous material which is superimposed on top of the dielectric top layer. Thus, the infrared sensor can be successfully disposed above the semiconductor device with sufficient thermal insulation therefrom, thereby making the whole infrared sensor unit compact sufficient to enable an application where a plurality of infrared sensor unit are arranged closely in a two-dimensional array.

Preferably, the thermal insulation support comprises a pair of posts projecting on the dielectric top layer and a pair of horizontal beam each extending from each of the posts and joining to the sensor mount in a parallel relation with a top plane of the dielectric top layer so as to support the sensor mount in a spaced relation from the semiconductor device. By provision of the posts, the infrared sensor carried on the sensor mount is spaced upwardly by a sufficient distance from the semiconductor device for assuring sufficient thermal isolation of the infrared sensor from the semiconductor substrate and the semiconductor device.

The dielectric top layer may be formed with an infrared reflector which reflects an infrared ray passing through the infrared sensor back to the infrared sensor in order to enhance sensitivity of the infrared sensor.

Also, an infrared ray absorber may be is provided to cover the top surface of the infrared sensor alone or in combination with the infrared reflector in order to enhance the sensitivity of the infrared sensor.

Further, the present invention provides a process of fabricating the infrared sensor unit. The process includes the steps of forming the semiconductor device in the top surface of the semiconductor substrate, and forming the dielectric layer on the top surface of the semiconductor substrate to conceal the semiconductor device therebehind. Subsequently, the dielectric layer is formed on its top with a pair of terminal pads followed by being laminated with a sacrifice layer while leaving in the sacrifice layer through-holes each of which leads to each of the terminal pads. Then, a porous material is superimposed on top of the sacrifice layer to give a porous layer with the through-holes being filled with the porous material, after which a portion of the porous layer is removed to give a thermal insulation structure of a predetermined pattern. Before or after removing the portion of the porous layer, the thermal infrared sensor is formed on the porous layer. Finally, the sacrifice layer is removed to obtain the infrared sensor unit. The thermal insulation structure is configured to include a pair of posts formed by the porous material filled in the through-holes, a sensor mount carrying the thermal infrared sensor, and a pair of horizontal beams each extending in a parallel relation with the top surface of the dielectric top layer from each of the posts to the sensor mount. Wirings are formed on each of the horizontal beams to extend from the infrared sensor to each of the terminal pad through each of the posts. Thus, by removal of the sacrifice layer, the sensor mount is supported above the semiconductor device by means of the horizontal beams and the posts. With the above process, a suitable porous material can be utilized for improving thermal isolation. The porous material can be selected from a suitable material not restricted by the semiconductor substrate to realize sufficient mechanical strength and thermal isolation. The porous material may be one of a silicon oxide, a siloxane-based organic polymer, or a siloxane-based inorganic polymer, or silica aerogel.

Further, it is preferred that a sol-gel solution of the porous material is coated on the sacrifice layer by means of a spin-coating technique, which is advantageous for facilitating to form the porous layer of uniform thickness.

These and still other advantageous features of the present invention will become more apparent from the following detailed description of the preferred embodiments when taken in conjunction with the attached drawings.

BEST MODE FOR CARRYING OUT THE INVENTION

Figure 1:
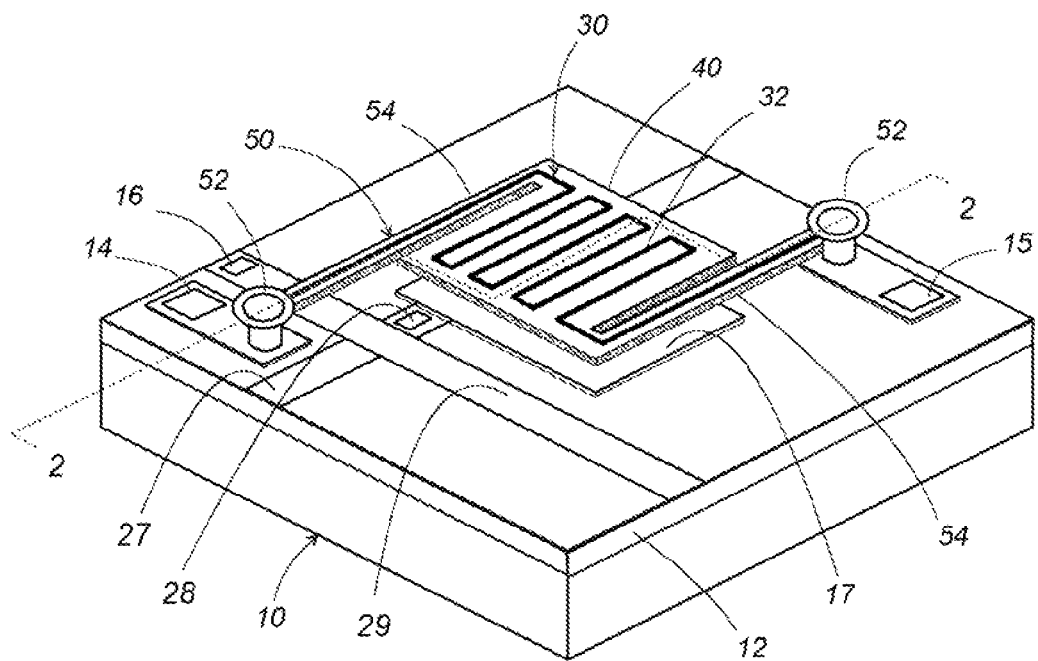
FIG. 1 is a perspective view of an infrared sensor unit in accordance with a first embodiment of the present invention.
Figure 2:
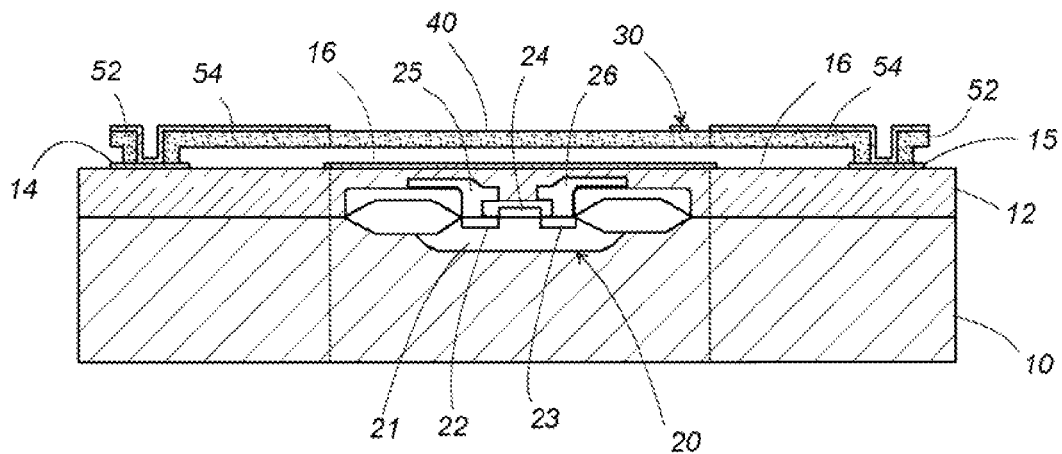
FIG. 2 is a sectional view taken along line 2-2 of FIG. 1

Referring now to FIGS. 1 and 2, there is shown an infrared sensor unit in accordance with a first embodiment of the present invention. The infrared sensor unit includes a semiconductor device 20 formed in the top surface of a semiconductor substrate 10 of monocrystal silicon and a thermal infrared sensor 30 supported to the substrate 10 in a spaced relation with the semiconductor device 20. The semiconductor device 20 is electrically coupled to the infrared sensor 30 to provide a sensor output to an external processing circuit where the sensor output is analyzed in terms of the amount the infrared radiation received at the infrared sensor 30 for temperature measurement or determination of presence of an object emitting the infrared radiation. One typical application is to arrange a plurality of the infrared sensor unit in a two-dimensional array to constitute a thermal image sensor.

The semiconductor device 20 is, for instance, a MOSFET transistor which is turned on and off to provide the sensor output in response to a trigger signal applied to the transistor. The transistor is fabricated by a well-know technique in the top surface of the substrate 10 and comprises a doped well region 21 with a drain 22 and a source 23, a gate 24, a drain electrode 25, source electrode 26, and a gate electrode 28. The electrodes are electrically connected respectively to terminal pads to be exposed on top of the infrared sensor unit. Hereinafter, the term "transistor" is utilized as representative of the semiconductor device 20, although the present invention is not limited to the use of the illustrated single transistor. A dielectric layer 12 made of $SiO_2$ or SiN, for example, is formed on substantially the entire top surface of the substrate 10 to conceal therebehind the transistor 20. When the transistor 20 is associated with an electrode pad or pads appearing on top of the substrate, the dielectric layer 12 is formed to cover the entire top surface of the substrate except for such pad or pads.

The thermal infrared sensor 30 is formed on a sensor mount 40 which is supported in a spaced relation with the transistor 20 to the substrate 10 by means of a thermal insulation support 50. The thermal infrared sensor 30 is made of a metal such titanium nitride deposited on the sensor mount to form a patterned strip 32 which gives a varying electric resistance in proportion to the amount or intensity of the incident infrared radiation.

Figure 3:
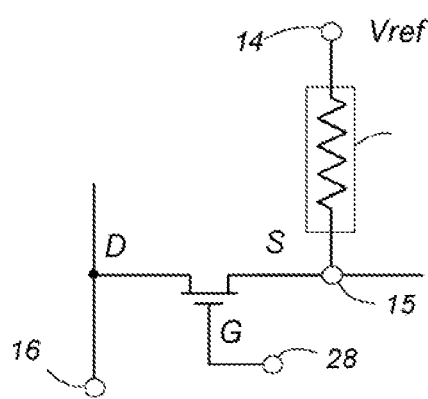
FIG. 3 is a circuit diagram of the above sensor unit.

The thermal insulation support 50 is composed of a pair of posts 52 projecting on the substrate 10 and a pair of horizontal beams 54 each extending from each of the posts 52 to one of diametrically opposed end of the sensor mount 40 in a parallel relation with the top plane of the substrate 10. The sensor mount 40, the posts 52, and the beams 54 are made of a porous material so as to thermally isolate the infrared sensor 30 effectively from the substrate 10 and the transistor 20. The porous material utilized in this embodiment is porous silica ($SiO_2$), and may be one of a siloxane-based organic polymer, or a siloxane-based inorganic polymer, or silica aerogel. The patterned strip 32 also extends over the beams 54 to the posts 52 for electrically connection to terminal pads 14 and 15 on the dielectric top layer 12. The pad 14 is connected to a reference voltage source Vref, while the other pad 15 is connected to the source electrode 26 of the transistor 20, as shown in FIG. 3. The gate electrode (not seen in FIG. 2) is connected through a buried line 27 to corresponding terminal pad 28 for connection with an external circuit of controlling the transistor 20 to turn on and off. The drain electrode 25 is connected through a buried line 29 to a terminal pad 16 to give the sensor output to an external circuit for detection of the infrared radiation from a target object.

An infrared reflector 17 made of a metal, for example, aluminum is formed on top of the dielectric top layer 12 in order to reflect the infrared radiation passing through the infrared sensor 30 back thereto for enhance sensitivity of the infrared sensor 30. The distance (d) between infrared sensor 30 and the infrared reflector 17 is set to be $d=\lambda/4$, where $\lambda$ is a wavelength of the infrared radiation from the target object. When using the infrared sensor for human detection, the distance is set to be 2.5 μm since the wavelength ($\lambda$) of the infrared radiation from the human is 10 μm.

The porosity of the porous material is preferred to be within a range of 40% to 80% for assuring sufficient mechanical strength and at the same time good thermal insulation effect.

It is noted in this connection that the porous silica ($SiO_2$) has a superior thermal isolation effect for satisfying minimum thermal conductance through the beams 54 to the substrate 10 and yet assuring minimum thermal capacity to the sensor mount 40, thereby improving the sensitivity of the infrared sensor.

Figure 4:
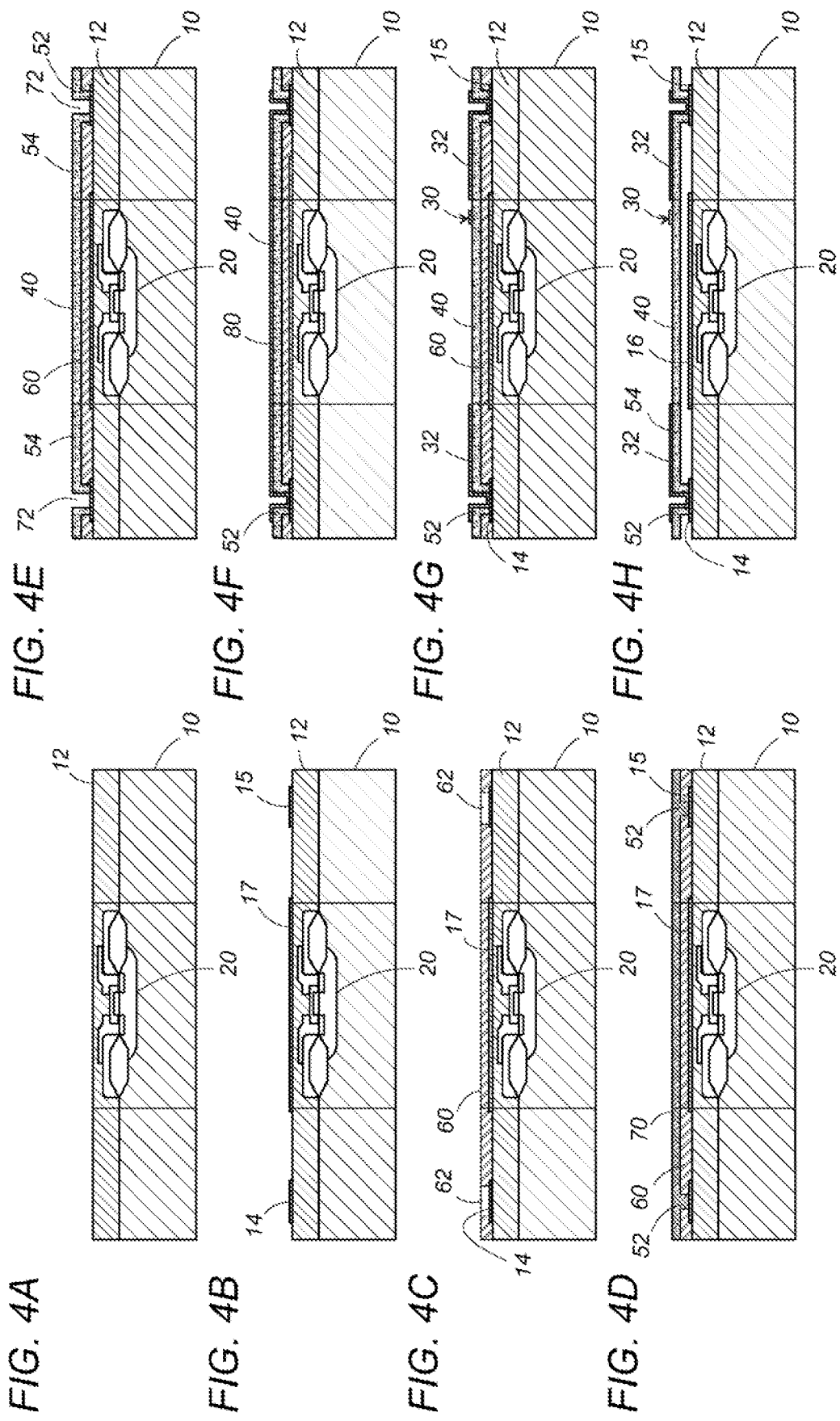
FIGS. 4A to 4H are sectional views illustrating the steps of fabricating the above infrared sensor unit.

The infrared sensor unit of the above configuration is fabricated through the steps shown in FIGS. 4A to 4H. After forming the transistor 20 on top of the semiconductor substrate 10, the dielectric top layer 12 of $SiO_2$ is formed to cover the entire top surface of the substrate 10 by thermal oxidization, as shown in FIG. 4A. Alternatively, the dielectric top layer 12 of SiN is formed by chemical vapor deposition. Then, aluminum layer is deposited by spattering on the dielectric top layer 12 followed by being selectively etched out to leave the terminal pads 14 and the infrared reflector 17 on the dielectric top layer 12, as shown in FIG. 4B. Then, a sacrifice layer 60 of a suitable resist material is applied by a spin coating technique to the entire top surface of the dielectric top layer 12 followed by being partly etched out to leave a pair of through-holes 62 each exposing the terminal pads 14, as shown in FIG. 4C. The sacrifice layer 60 may be alternatively made of a polyimide formed by the spin coating, or of a meal formed by deposition or even of a polysilicon formed by chemical vapor deposition. The through-holes 62 may be formed by lithography when the sacrifice layer 60 is made of the resist material, and by dry-etching, wet-etching or lithography when the sacrifice layer 60 is made of polyimide, and by dry-etching or wet-etching when the sacrifice layer 60 is made of metal or polysilicon.

Subsequently, a solution of porous silica ($SiO_2$) is applied over the sacrifice layer 60 by the spin coating technique to form a porous layer 70 and the posts 52 in the through-holes, as shown in FIG. 4D. Thereafter, the porous layer 70 is masked by a suitable resist and selectively etched out to develop the sensor mount 40 and the respective beams 54, and at the same time to form via-holes 72 in the respective posts 52, as shown in FIG. 4E. Next, titanium 80 is deposited by spattering on the sensor mount 40, the beams 54 and into the via-holes 72 followed by forming a protective layer of titanium nitride by spattering on the titanium layer, as show in FIG. 4F. Subsequently, the titanium layer 80 and the protective layer are selectively etched out to leave a patterned strip 32 of the infrared sensor 30 over the sensor mount 40 and the beams 54 and to complete the electrical connection of the patterned strip 32 to the respective terminal pads 14 and 15 through the posts 52, as shown in FIG. 4G. Finally, the sacrifice layer 60 is etched out to obtain the infrared sensor unit, as shown in FIG. 4H.

Figure 5:
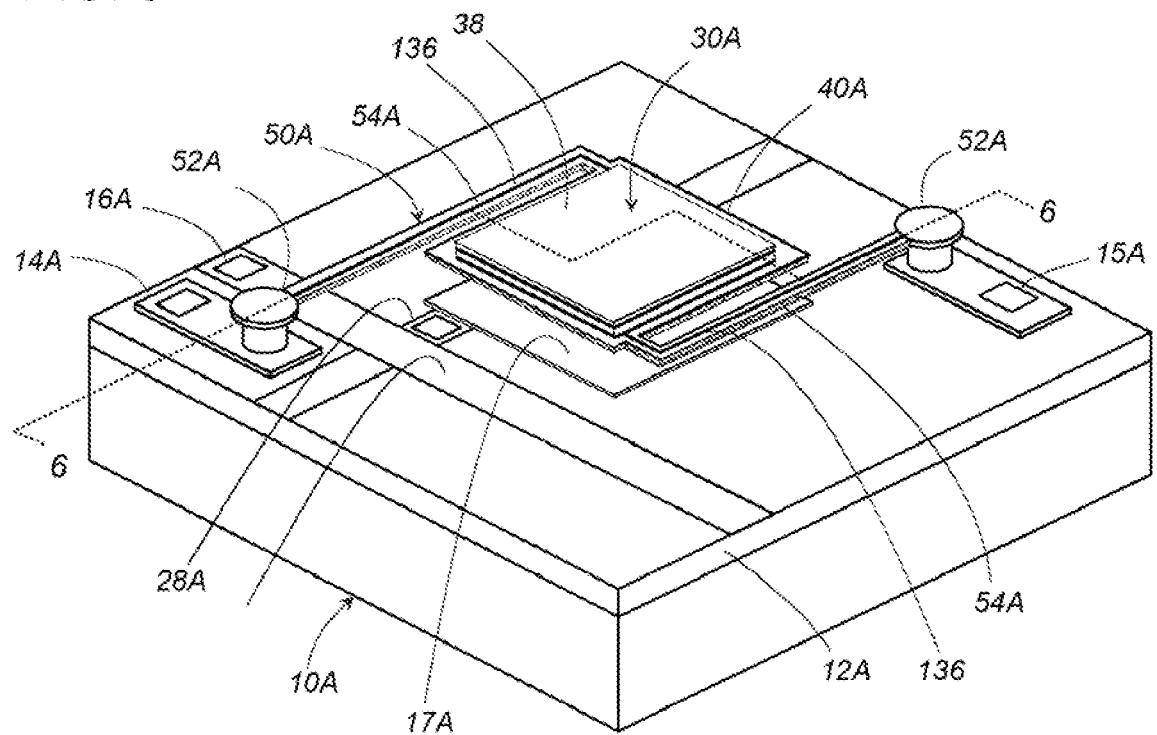
FIG. 5 is a perspective view of an infrared sensor unit in accordance with a second embodiment of the present invention.
Figure 6:
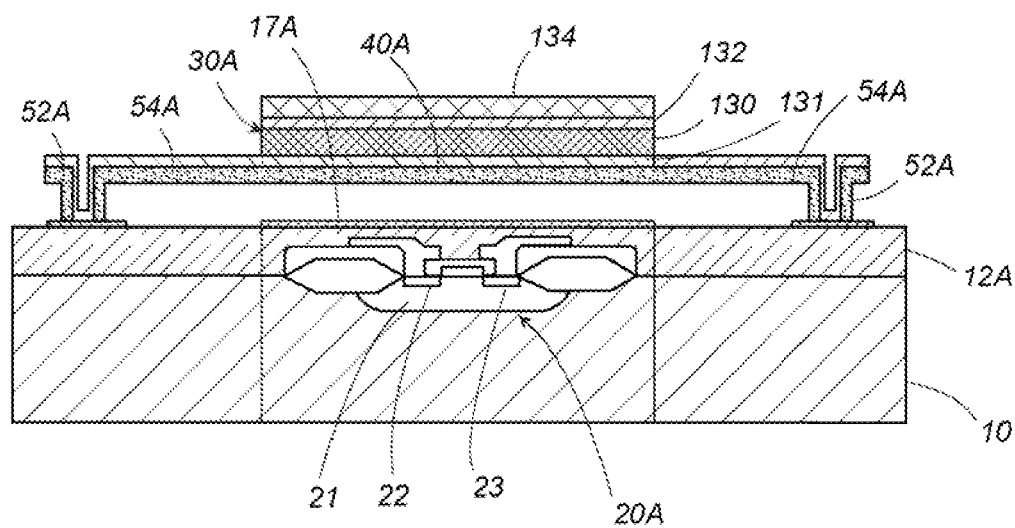
FIG. 6 is a sectional view taken along line 6-6 of FIG. 5.

FIGS. 5 and 6 illustrate an infrared sensor unit in accordance with a second embodiment of the present invention which is identical to the first embodiment except for a structure of the thermal infrared sensor 30A. Like parts are designated by like reference numerals with a suffix letter of "A", and no duplicate explanation is made herein for the purpose of simplicity.

The thermal infrared sensor 30A is composed of a resistive layer 130 of an amorphous silicon held between a lower electrode 131 and an upper electrode 132 which are respectively connected through wirings 136 to the terminal pads 14A and 15A. The resistive layer 130 exhibits a varying electric resistance between the upper and lower electrodes in response to the change of the amount of the incident infrared radiation. Thus configured infrared sensor 30A is carried on a sensor mount 40A which is supported to the semiconductor substrate 10A by means of a thermal insulation support 50A which is made of a porous material and is composed of a pair of posts 52A and a pair of horizontal beams 54A each extending from each post to the diametrically opposed end of the sensor mount 40A as in the first embodiment. An infrared absorber 134 is deposited on the upper electrode 132 to effectively collect the infrared radiation. The infrared absorber 134 may be formed by SiON, $Si_3N_4$, $SiO_2$, or gold black.

Figure 7A:
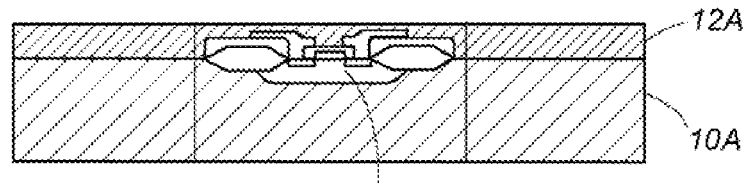
FIGS. 7A to 7K are sectional views illustrating the steps of fabricating the above infrared sensor unit.
Figure 7B:
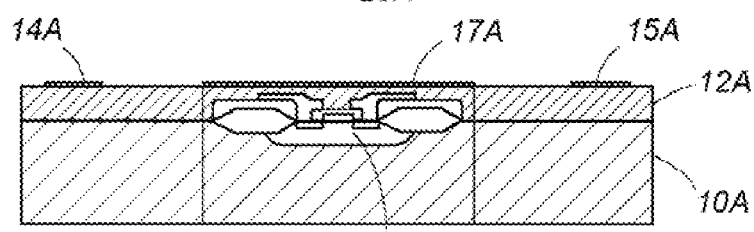
Figure 7C:
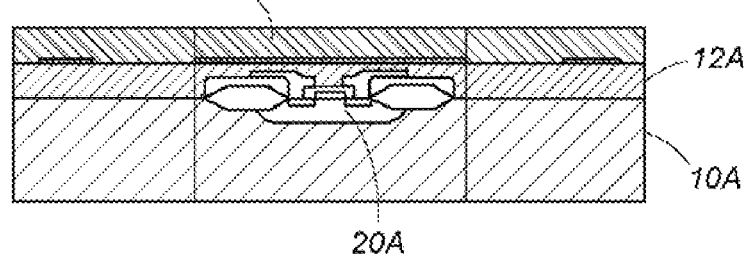
Figure 7D:
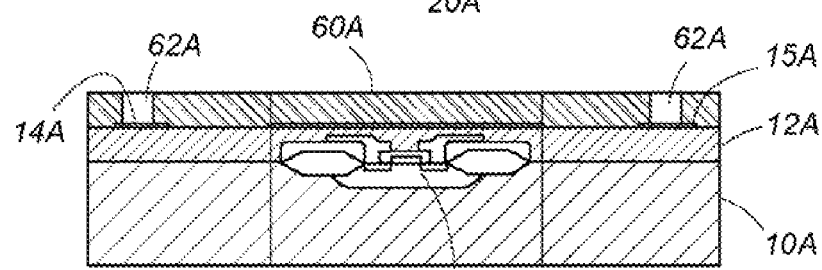
Figure 7E:
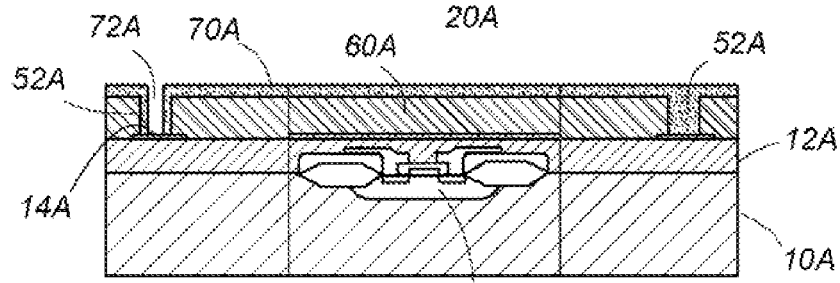

The process of fabricating the infrared sensor unit will be now explained with reference to FIGS. 7A to 7K. After forming the transistor 20A on top of the semiconductor substrate 10A of monocrystal silicon, the dielectric top layer 12 of $SiO_2$ is formed to cover the entire top surface of the substrate 10A by thermal oxidization, as shown in FIG. 7A. Then, aluminum layer is deposited by spattering on the dielectric top layer 12A followed by being selectively etched out to leave the terminal pads 14A, 15A, and the infrared reflector 17A on the dielectric top layer 12A, as shown in FIG. 7B. Then, a sacrifice layer 60A of a suitable resist material is applied by a spin coating technique to the entire top surface of the dielectric top layer 12A, as shown in FIG. 7C. Then, portions of the sacrifice layer 60A is etched out to leave a pair of through-holes 62A each exposing the terminal pads 14A and 15A, as shown in FIG. 7D. Subsequently, a solution of porous silica ($SiO_2$) is applied over the sacrifice layer 60A by the spin coating technique to form a porous layer 70A and the posts 52A in the through-holes 62A, after which one of the posts is partly etched out to form a via-hole 72A exposing the terminal pad 14A, as shown in FIG. 7E.

Figure 7F:
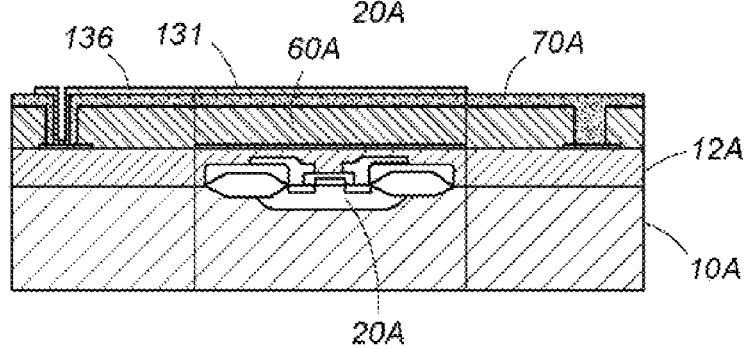
Figure 7G:
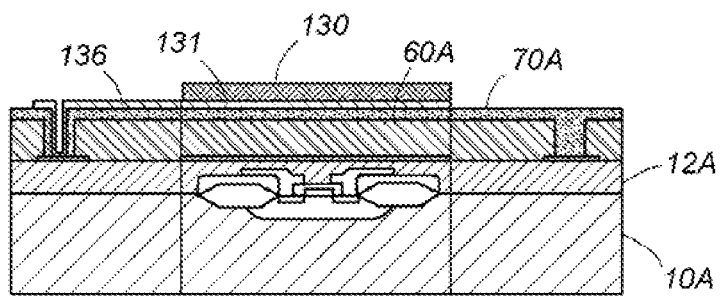
Figure 7H:
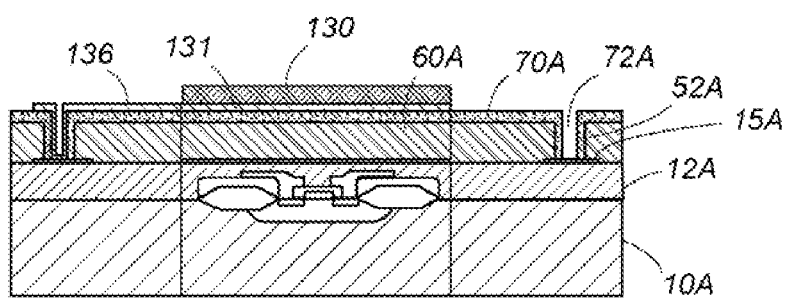
Figure 7I:
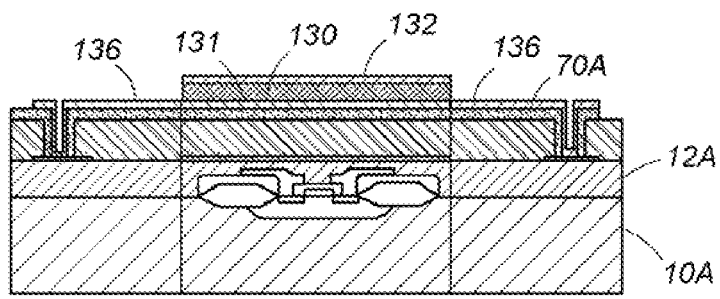
Figure 7J:
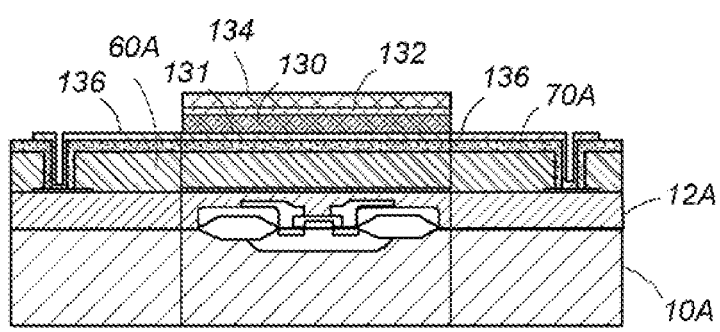
Figure 7K:
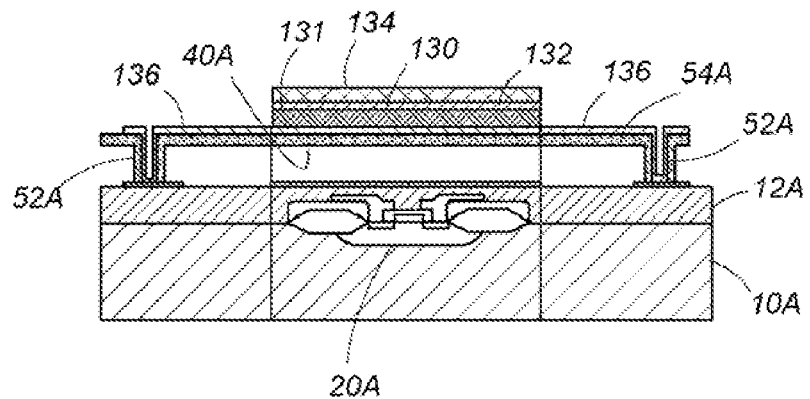

Next, chromium is deposited by spattering on the porous layer 70A followed by being selectively etched out to form the lower electrode 131 and the associated wiring 136 on the porous layer 70A, as shown in FIG. 7F. Amorphous silicon is then deposited by chemical vapor deposition (CVD) method on the porous layer 70A over the lower electrode 131 followed by being selectively etched out to form the resistive layer 130 on the lower electrode 131, as shown in FIG. 7G. Then, the porous layer 70A extending into the post 52A is selectively etched out to leave a via-hole 72A expositing the associated terminal pad 15A, as shown in FIG. 7H. Chrominum is then deposited on the porous layer 70A and the resistive layer 130, and is selectively etched out to form the upper electrode 132 and the associated wiring 136 which extends from the upper electrode to the terminal pad 15A, as shown in FIG. 7I. Then, a SiON layer is deposited on the porous layer 70A over the upper electrode 132 and the associated wirings 136, and is subsequently etched out to form the infrared absorber 134 on top of the upper electrode 132, as shown in FIG. 7J. After the porous layer 70A is masked by a suitable resist and selectively etched out to leave the sensor mount 40A and the respective beams 54A, the sacrifice layer 60A is etched out to obtain the infrared sensor unit, as shown in FIG. 7K.

In the above illustrated embodiments, the porous layer or the correspondingly formed parts are made of porous silica. However, the present invention may use another porous material including a siloxane-based organic polymer such as methyl-containing polysiloxane, siloxane-based inorganic polymer such as SiH containing siloxane, and silica aerogel.

Further, the porous material may be a porous matrix composite including hollow minute particles and a matrix-forming material. The hollow minute particle is defined to have a cavity surrounded by a shell which is preferably made of a metal oxide or silica. The hollow minute particle may be selected from those disclosed in the patent publication JP 2001-233611 or commercially available. Particularly, the shell is made of a material selected alone or in combination from $SiO_2$, $SiOX$, $TiO_2$, $TiO_x$, $SnO_2$, $CeO_2$, $Sb_2O_5$, ITO, ATO, and $Al_2O_3$. After being coated on the substrate and dried, the porous matrix composite gives the porous layer having low thermal conductivity and low specific heat. Within the porous layer, the hollow minute particles are dispersed as fillers and are bound in the matrix. The matrix-forming material may be a silicon compound of a first type containing siloxane bond or silicon compound of a second type which develops siloxane bonds while being formed into a film or layer. The silicon compound of the second type may contain the siloxane bond. The silicon compounds of the first and second types include an organic silicon compound, silicon halide compound (for example, silicon chloride and silicon fluoride), and organic silicon halide compound containing organic group and halogen.

The silicon compound may be a hydrolysable organosilane, a hydrolytic compound formed by partial or complete hydrolysis of the organosilane, or a condensation compound of the hydrolytic compound. The hydrolysable organosilane is expressed by the following general formula:

$$R_nSiY_{4-n}$$

wherein R represents a substitutable or non-substitutable univalent hydrocarbon group of the same or different kind having a carbon atom number of 1 to 9, n is an integer of 0 to 2, and Y is a hydrolysable functional group.

R in the above general formula includes an alkyl group (such as methyl group, ethyl group, propyl group, butyl group, pentyl group, hexyl group, peptyl group, and octyl group); cycloalkyl group (such as cyclopentyl group, and cyclohexyl group); aralkyl group (such as 2-phenyl-ethyl group, 2-phenylpropyl group, and 3-phenyl-propyl group); aryl group (such as phenyl group and tolyl group); alkenyl group (such as vinyl group and allyl group); halogen substituted hydrocarbon group (such as chloromethyl group, γ-chloropropyl group, and 3,3,3-trifluoropropyl group); and substituted hydrocarbon group (such as γ-methacryloxy-propyl group, γ-glycidoxy-propyl group, 3,4-epoxycyclohexylethyl group, and γ-mercapto-propyl group). Alkyl group having a carbon atom number of 1 to 4 and phenyl group are preferred in view of availability and easy synthesis feasibility.

The hydrolysable functional group includes alkoxy group, acetoxy group, oxime group (—O—N=C—R(R')), enoxy group (—O—C(R)=C(R')R"), amino group, aminoxy group (—O—N(R)R'), and amid group (—N(R)—C(=O)—R'), wherein R, R', and R" are respectively hydrogen or univalent hydrocarbon. Among these groups alkoxy group is preferred in view of availability.

The hydrolysable organo-silane includes di-, tri-, and tetra-functional organo-silane having n of 0 to 2 in the above formula, such as alkoxy-silane, acetoxy-silane, oxym-silane, enoxy-silane, amino-silane, and aminoxy-silane, amide-silane. Among these, alkoxy-silane is preferred in view of availability. Alkoxy-silane includes tetra-alkoxy-silane [n=0] (such as tetramethoxy-silane and tetraethoxy-silane); organo trialkoxy-silane [n=1] (such as methyl-trimethoxy-silane, methyl-triethoxy-silane, methyl-trisopropoxy-silane, phenyl-trimethoxy-silane, phenyl-triethoxy-silane, and 3,3,3-trifluoropropyl-tri-methoxy-silane), and diorgano-dialkoxy-silane [n=2](such as dimethyl-dimethoxy-silane, dimethyl-dietoxy-silane, diphenyl-dimethoxy-silane, diphenyl-diethoxy-silane, and methyl-phenyl-dimethoxy-silane).

Although the above embodiments show the use of the infrared sensor which exhibits an electrical resistance varying in response to the amount or changing rate of the amount of the incident radiation, it is equally possible to utilize an infrared sensor of a type exhibiting a varying permittivity, of a thermopile type generating a thermal electromotive force, or of a pyroelectric type generating a voltage difference in response to the change rate of the amount of the infrared radiation.

The invention claimed is:

1. An infrared sensor unit comprising:
   a semiconductor substrate which is configured to be formed in its top surface with a semiconductor device and to be covered by a dielectric top layer concealing said semiconductor device;
   a thermal infrared sensor;
   a sensor mount carrying said thermal infrared sensor;
   a thermal insulation support which is configured to floatingly support said sensor mount above said semiconductor device;
   wherein both of said sensor mount and said thermal insulation support are made of a porous material which is superimposed on top of said dielectric top layer,
   wherein said thermal insulation support comprises a pair of posts projecting on said dielectric top layer and a pair of horizontal beam each extending from each of said posts and joining to said sensor mount in a parallel relation with said dielectric top layer so as to support said sensor mount in a spaced relation from said semiconductor device, and
   wherein said thermal infrared sensor includes a patterned strip or wiring made of a metal which is deposited on said sensor mount and said horizontal beams and into respective via-holes in said posts to extend over said sensor mount, said horizontal beams, and said posts for electrical connection to terminal pads on said dielectric top layer.

2. The infrared sensor unit as set forth in claim 1, wherein said porous material is silicon oxide.

3. The infrared sensor unit as set forth in claim 1, wherein an infrared reflector is formed on said dielectric top layer in order to reflect an infrared ray passing through said infrared sensor back to said infrared sensor.

4. The infrared sensor unit as set forth in claim 1, wherein an infrared ray absorber is provided to cover the top surface of the infrared sensor.

5. A process of fabricating an infrared sensor unit comprising the steps of:
   forming a semiconductor device in a top surface of a semiconductor substrate;
   forming a dielectric top layer on the top surface of said semiconductor substrate to conceal said semiconductor device therebehind;
   forming a pair of terminal pads on said dielectric top layer;
   laminating a sacrifice layer on said dielectric layer while leaving through-holes in said sacrifice layer, each of said through-holes leading to said each of said terminal pads;
   superimposing a porous material on top of said sacrifice layer to form a porous layer and filling said through-holes with said porous material;
   etching out a portion of said porous layer to give a thermal insulation structure of a predetermined pattern,
   forming a thermal infrared sensor on said thermal insulation structure; and
   removing said sacrifice layer;
   wherein said thermal insulation structure comprises a pair of posts formed by said porous material filled in said through-holes, a sensor mount carrying said thermal infrared sensor, and a pair of horizontal beams each extending in a parallel relation with the top surface of said dielectric top layer from each of said posts to said sensor mount, and wherein
   a patterned strip or wirings are deposited on said sensor mount as well as said horizontal beams and into via-holes in said posts to extend along each of said horizontal beams from said infrared sensor to each of said terminal pads through each of said posts,
   said sensor mount being supported above said semiconductor device through said horizontal beams by removal of said sacrifice layer.

6. The process as set forth in claim 5, wherein a sol-gel solution of said porous material is coated on said sacrifice layer by means of a spin-coating technique.

* * * * *